US 012353130B2

(12) United States Patent
Tajiri et al.

(10) Patent No.: US 12,353,130 B2
(45) Date of Patent: Jul. 8, 2025

(54) PHOTOSENSITIVE RESIN COMPOSITION AND PHOTOSENSITIVE RESIN MULTILAYER BODY

(71) Applicant: ASAHI KASEI KABUSHIKI KAISHA, Tokyo (JP)

(72) Inventors: Tonami Tajiri, Tokyo (JP); Junya Kosaka, Tokyo (JP); Teruhisa Yamada, Tokyo (JP); Shinichi Kunimatsu, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 587 days.

(21) Appl. No.: 17/775,829

(22) PCT Filed: Nov. 11, 2020

(86) PCT No.: PCT/JP2020/042140
§ 371 (c)(1),
(2) Date: May 10, 2022

(87) PCT Pub. No.: WO2021/095784
PCT Pub. Date: May 20, 2021

(65) Prior Publication Data
US 2022/0390843 A1    Dec. 8, 2022

(30) Foreign Application Priority Data

Nov. 11, 2019  (JP) ................. 2019-204176
Apr. 13, 2020  (JP) ................. 2020-071836

(51) Int. Cl.
*G03F 7/033*    (2006.01)
*G03F 7/029*    (2006.01)
*H01L 23/00*    (2006.01)

(52) U.S. Cl.
CPC .............. *G03F 7/033* (2013.01); *G03F 7/029* (2013.01); *H01L 24/11* (2013.01); *H01L 2224/1146* (2013.01)

(58) Field of Classification Search
None
See application file for complete search history.

(56) References Cited

U.S. PATENT DOCUMENTS 5,300,401 A      4/1994  Fujikura et al.
7,195,847 B2 *   3/2007  Sato ................ G03F 7/095
                                             430/7
(Continued)

FOREIGN PATENT DOCUMENTS

CN    103282829 A    9/2013
CN    106918995 A    7/2017
(Continued)

OTHER PUBLICATIONS

Japanese Office Action for Japanese Application No. 2021-556134, dated Apr. 18, 2023.
(Continued)

*Primary Examiner* — Sanza L. McClendon
(74) *Attorney, Agent, or Firm* — Birch, Stewart, Kolasch & Birch, LLP

(57) ABSTRACT

The present invention provides a photosensitive resin multilayer body which is obtained by superposing, on a supporting film, a photosensitive resin layer containing a photosensitive resin composition that contains from 10% by mass to 90% by mass of (A) an alkali-soluble polymer, from 5% by mass to 70% by mass of (B) a compound having an ethylenically unsaturated double bond and from 0.01% by mass to 20% by mass of (C) a photopolymerization initiator; the alkali-soluble polymer (A) contains a copolymer which contains, as a copolymerization component, a (meth)acrylate that has an alkyl group having from 3 to 12 carbon (Continued)

(a)

(b)

atoms; an acrylate monomer is contained, as the compound (B) having an ethylenically unsaturated double bond, in an amount of from 51% by mass to 100% by mass relative to the total amount of the compound (B) having an ethylenically unsaturated double bond; the absorbance A of the photosensitive resin layer containing the photosensitive resin composition at a wavelength of 365 nm, said photosensitive resin layer having a film thickness T (μm), satisfies the relational expression $0<A/T\leq0.007$; and the film thickness of the photosensitive resin layer containing the photosensitive resin composition is from 40 μm to 600 μm.

16 Claims, 2 Drawing Sheets

(56) References Cited

U.S. PATENT DOCUMENTS

| | | | | |
|---|---|---|---|---|
| 10,338,468 | B2* | 7/2019 | Yoshida | G03F 7/20 |
| 2007/0159584 | A1* | 7/2007 | Sato | G03F 7/095 |
| | | | | 430/321 |
| 2016/0327861 | A1* | 11/2016 | Foreman | G03F 7/033 |
| 2017/0285474 | A1 | 10/2017 | Yoshida et al. | |
| 2020/0012190 | A1 | 1/2020 | Irisawa et al. | |

FOREIGN PATENT DOCUMENTS

| | | | |
|---|---|---|---|
| JP | 3-200804 | A | 9/1991 |
| JP | 5-241340 | A | 9/1993 |
| JP | 5-341532 | A | 12/1993 |
| JP | 2012-58675 | A | 3/2012 |
| JP | 2013-57902 | A | 3/2013 |
| JP | 2013-246387 | A | 12/2013 |
| JP | 2017-181957 | A | 10/2017 |
| WO | WO 2011/037182 | A1 | 3/2011 |
| WO | WO 2015/178462 | A1 | 11/2015 |
| WO | WO 2016/047691 | A1 | 3/2016 |
| WO | WO 2016-163540 | A1 | 10/2016 |
| WO | WO 2018/164217 | A1 | 9/2018 |

OTHER PUBLICATIONS

International Preliminary Report on Patentability and English translation of the Written Opinion of the International Searching Authority for International Application No. PCT/JP2020/042140, dated May 17, 2022.

International Search Report for International Application No. PCT/JP2020/042140, dated Jan. 26, 2021, with English translation.

Written Opinion of the International Searching Authority for International Application No. PCT/JP2020/042140, dated Jan. 26, 2021, with English translation.

* cited by examiner (a)

(b)

(a)

(b)

PHOTOSENSITIVE RESIN COMPOSITION AND PHOTOSENSITIVE RESIN MULTILAYER BODY

FIELD

The present invention relates to a photosensitive resin composition, and a photosensitive resin multilayer film and a method for forming a resist pattern or a semiconductor bump using the same.

BACKGROUND ART

Conventionally, the production of printed wiring boards and the precision processing of metals have been carried out by a photolithography method. A photosensitive resin composition used in the photolithography method is classified into a negative-type composition which dissolves and removes an unexposed portion, and a positive-type composition which dissolves and removes an exposed portion.

In the photolithography method, when the photosensitive resin composition is applied on a substrate, one of:

(1) a method in which a photoresist solution is applied on a substrate and then dried, and (2) a method in which a photosensitive resin composition is laminated on a substrate using a photosensitive resin multilayer film in which a support and a layer comprising a photosensitive resin composition (hereinafter also referred to as "photosensitive resin layer"), and optionally a protective layer, are sequentially laminated is used. In the production of a printed wiring board, the latter method is often used.

A method for forming a pattern using the above photosensitive resin multilayer film will be briefly described below. First, the protective layer is stripped from the photosensitive resin multilayer film. Then, using a laminator, the photosensitive resin layer and the support are laminated on a substrate such as a copper-clad laminate and a copper sputtered thin film in the order of the substrate, the photosensitive resin layer and the support. Then, the photosensitive resin layer is exposed through a photomask having a desired wiring pattern. The support is stripped from the exposed laminated film, and then the non-patterned portion is dissolved or dispersed and removed with a developing solution to form a resist pattern on the substrate.

By subjecting the substrate with the resist pattern to a plating process such as copper plating or solder plating, bumps for the semiconductor can be formed.

Various photosensitive resin compositions have been studied for the formation of resist patterns or semiconductor bumps. For example, PTLs 1 to 5 mention photosensitive resin compositions comprising a specific alkali-soluble polymer, a monomer and a photopolymerizable initiator.

CITATION LIST

Patent Literature

[PTL 1] WO 2018/164217
[PTL 2] Japanese Unexamined Patent Publication (Kokai) No. H5-341532 A
[PTL 3] Japanese Unexamined Patent Publication (Kokai) No. H5-241340 A
[PTL 4] Japanese Unexamined Patent Publication (Kokai) No. H3-200804 A
[PTL 5] WO 2015/178462

SUMMARY

Technical Problem

In order to cope with recent miniaturization and high densification of wiring, a finished line width of a conductor line (for example, copper line) after etching is strictly required. A phenomenon in which a cured resist pattern is dissolved according to the type of a stripping solution (hereinafter also referred to as "stripped piece dissolution"), and there has been reported a phenomenon in which plating penetrates into the post bottom of the substrate from which the cured resist pattern was stripped off after the plating process (hereinafter also referred to as "under-plating").

However, the photosensitive resin compositions mentioned in PTLs 1 to 5 do not pay attention to the stripped piece dissolution and under-plating, or there is room for improvement in the stripped piece dissolution and under-plating.

Therefore, an object of the present invention is to provide a photosensitive resin composition capable of improving the properties related to stripped piece dissolution and under-plating, and a photosensitive resin multilayer film and a method for forming a resist pattern or a semiconductor bump using the same.

Solution to Problem

The present inventors have intensively studied, and after making repeated experiments, they have found that the above problems can be solved by the following technical means, thus completing the present invention. The present invention exemplifies the following embodiments.

(1)

A photosensitive resin multilayer film comprising a support film and a photosensitive resin layer comprising a photosensitive resin composition comprising:

(A) an alkali-soluble polymer: 10% by weight to 90% by weight, (B) a compound having an ethylenically unsaturated double bond: 5% by weight to 70% by weight, and (C) a photopolymerization initiator: 0.01% by weight to 20% by weight, the photosensitive resin layer being laminated on the support film, wherein the alkali-soluble polymer (A) comprises a copolymer comprising a (meth)acrylate which has an alkyl group having 3 to 12 carbon atoms as a copolymerization component, an acrylate monomer is contained as the compound having an ethylenically unsaturated double bond (B) in an amount of 51% by weight to 100% by weight based on the total amount of the compound having an ethylenically unsaturated double bond (B), a relationship represented by the following inequality (I) is satisfied:

$$0 < A/T \leq 0.007 \qquad \text{Inequality (I)}$$

where $T$ (μm) is a thickness of the photosensitive resin layer comprising the photosensitive resin composition, and $A$ is an absorbance at a wavelength of 365 nm, and the thickness of the photosensitive resin layer comprising the photosensitive resin composition is 40 μm or more and 600 μm or less.

(2)

The photosensitive resin multilayer film according to the item (1), wherein the alkali-soluble polymer (A) comprises a copolymer comprising 2-ethylhexyl acrylate as the copolymerization component.

(3)

The photosensitive resin multilayer film according to the item (1) or (2), wherein the alkali-soluble polymer (A) comprises a copolymer comprising benzyl (meth)acrylate as the copolymerization component.

[Chemical Formula 1]

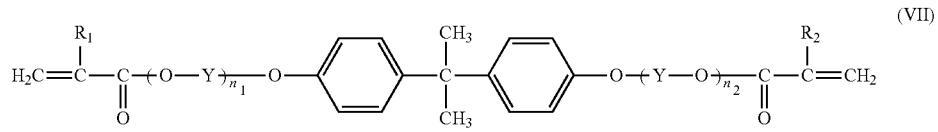

(4)

The photosensitive resin multilayer film according to any one of the items (1) to (3), wherein the alkali-soluble polymer (A) further comprises a (meth)acrylate and/or a vinyl compound other than the (meth)acrylate which has an alkyl group having 3 to 12 carbon atoms as the copolymerization component, and
the alkali-soluble polymer (A) comprises the (meth)acrylate which has an alkyl group having 3 to 12 carbon atoms as the copolymerization component in an amount of 6.0% by weight to 30% by weight.

(5)

The photosensitive resin multilayer film according to any one of the items (1) to (4), wherein a trifunctional or higher polyfunctional acrylate group-containing compound is contained as the compound having an ethylenically unsaturated double bond (B).

(6)

The photosensitive resin multilayer film according to the item (5), wherein a compound having an acrylate group in any of trimethylolpropane, pentaerythritol and dipentaerythritol backbones is contained as the trifunctional or higher polyfunctional acrylate group-containing compound.

(7)

The photosensitive resin multilayer film according to the item (5) or (6), wherein a compound having an acrylate group in any of trimethylolpropane, pentaerythritol and dipentaerythritol backbones is contained as the trifunctional or higher polyfunctional acrylate group-containing compound in an amount of 1% by weight or more based on the total amount of the compound having an ethylenically unsaturated double bond (B).

(8)

The photosensitive resin multilayer film according to any one of the items (5) to (7), wherein a compound having an acrylate group in any of trimethylolpropane, pentaerythritol and dipentaerythritol backbones is contained as the trifunctional or higher polyfunctional acrylate group-containing compound in an amount of 10% by weight or more based on the total amount of the compound having an ethylenically unsaturated double bond (B).

(9)

The photosensitive resin multilayer film according to any one of the items (5) to (8), wherein a compound having an acrylate group in any of trimethylolpropane, pentaerythritol and dipentaerythritol backbones is contained as the trifunctional or higher polyfunctional acrylate group-containing compound in an amount of 80% by weight or more based on the total amount of the compound having an ethylenically unsaturated double bond (B).

(10)

The photosensitive resin multilayer film according to any one of the items (1) to (9), wherein, when a compound having an aromatic ring is contained as the compound having an ethylenically unsaturated double bond (B), the compound having an aromatic ring is represented by the following formula (VII):

wherein Y each independently represents an alkylene group having 2 to 10 carbon atoms, $R_1$ and $R_2$ each independently represent a methyl group or a hydrogen atom, and $n_1$ and $n_2$ each independently represent an integer of 1 to 100.

(11)

The photosensitive resin multilayer film according to any one of the items (1) to (10), comprising, as the photopolymerization initiator (C), an imidazole compound.

(12)

The photosensitive resin multilayer film according to any one of the items (1) to (11), comprising, as the photopolymerization initiator (C), a 2,4,5-triarylimidazole dimer.

(13)

The photosensitive resin multilayer film according to any one of the items (1) to (12), wherein a relationship represented by the following inequality (II) is satisfied:

$$0 < A/T \leq 0.005 \qquad \text{Inequality (II)}$$

where T (μm) is a thickness of the photosensitive resin layer comprising the photosensitive resin composition, and A is an absorbance at a wavelength of 365 nm.

(14)

The photosensitive resin multilayer film according to any one of the items (1) to (13), wherein the thickness of the photosensitive resin layer comprising the photosensitive resin composition is more than 50 μm and 400 μm or less.

(15)

The photosensitive resin multilayer film according to any one of the items (1) to (14), which is a dry film resist.

(16)

A method for forming a resist pattern, which comprises the steps of:
laminating the photosensitive resin multilayer film according to any one of the items (1) to (15) on a substrate,
exposing the laminated photosensitive resin multilayer film, and
developing the exposed photosensitive resin multilayer film.

(17)

A method for forming a semiconductor bump, which comprises the steps of:
laminating the photosensitive resin multilayer film according to any one of the items (1) to (15) on a sputtered copper thin film, exposing the laminated photosensitive resin multilayer film, developing the exposed photosensitive resin multilayer film, and subjecting the developed sputtered copper thin film to copper plating or solder plating.

Advantageous Effects of Invention

According to the present invention, it is possible to improve the properties related to stripped piece dissolution and under-plating of the resist pattern.

DESCRIPTION OF EMBODIMENTS

Figure 1:
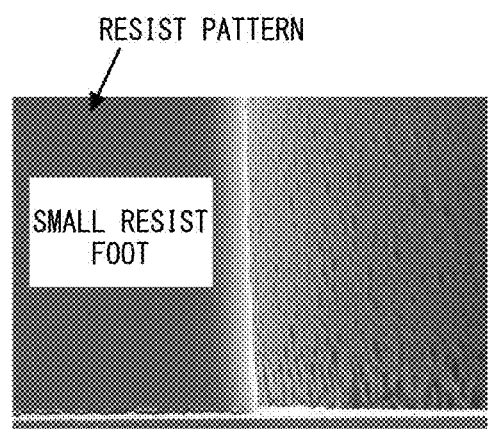
FIG. 1 is a SEM photograph showing an example of a small resist foot (a) and small under-plating (b).
Figure 1:
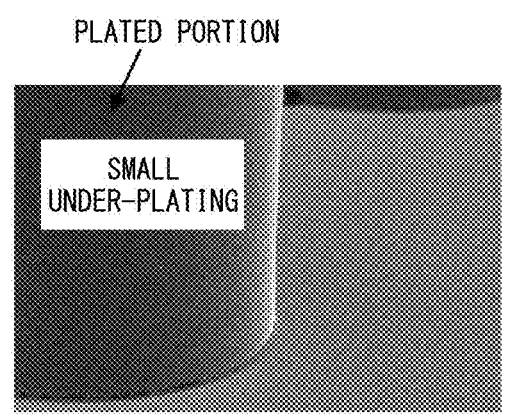

The mode for carrying out the present invention (hereinafter abbreviated as "embodiment") will be described in detail below. The present invention is not limited to the following embodiments and various modifications can be made within the scope of the present invention.

<Photosensitive Resin Composition>

One embodiment provides:

a photosensitive resin composition comprising:
(A) an alkali-soluble polymer: 10% by weight to 90% by weight,
(B) a compound having an ethylenically unsaturated double bond: 5% by weight to 70% by weight, and
(C) a photopolymerization initiator: 0.01% by weight to 20% by weight, the photosensitive resin layer being laminated on the support film, wherein the alkali-soluble polymer (A) comprises a copolymer comprising a (meth)acrylate which has an alkyl group having 3 to 12 carbon atoms as a copolymerization component, and an acrylate monomer is contained as the compound having an ethylenically unsaturated double bond (B) in an amount of 51% by weight to 100% by weight based on the total amount of the compound having an ethylenically unsaturated double bond (B).

It is understood that the photosensitive resin composition of the present disclosure can realize an improvement in properties related to stripped piece dissolution and under-plating of a resist pattern by using the respective components (A) to (C) in a specific ratio, for example, by means as exemplified below (but not limited thereto). Further, the photosensitive resin composition according to the present embodiment may optionally comprise, in addition to the components (A) to (C), a polymer other than the component (A), a monomer other than the component (B), and initiators, dyes, auxiliary adhesion agents, and plasticizers other than the components (C). The respective components contained in the photosensitive resin composition of the present embodiment will be described below in order.

<(A) Alkali-Soluble Polymer>

The alkali-soluble polymer (A) in the present embodiment is a polymer which can be dissolved in an aqueous alkaline solution, and can be, for example, a vinyl-based polymer having a carboxyl group. In the present embodiment, the alkali-soluble polymer (A) comprises a copolymer comprising a (meth)acrylate (A1) which has an alkyl group having 3 to 12 carbon atoms as the copolymerization component, and is preferably a copolymer comprising an acrylate (A1) as the copolymerization component in an amount of 6.0 to 30% by weight based on the weight of the alkali-soluble polymer (A), and more preferably a copolymer comprising a (meth)acrylate (A1) and a (meth)acrylate (A2) other than a (meth)acrylate (A1) and/or a vinyl compound (A3) as the copolymerization component. The alkali-soluble polymer (A) can be, for example, a copolymer comprising, in addition to the (meth)acrylate (A1) which has an alkyl group having 3 to 12 carbon atoms, a monomer selected from a (meth)acrylic acid, a (meth)acrylate which has an alkyl group having 2 or less carbon atoms and/or 13 or more carbon atoms, a (meth)acrylate having an aromatic group, a (meth)acrylonitrile, and a (meth)acrylamide as the copolymerization component.

The alkali-soluble polymer (A) has a carboxyl group and preferably has an acid equivalent of 100 to 600. The acid equivalent refers to the mass in grams of the alkali-soluble polymer having 1 equivalent of a carboxyl group therein. It is preferable to adjust the acid equivalent to 100 or more from the viewpoint of improving the development resistance, resolution and adhesion, while it is preferable to adjust the acid equivalent to 600 or less from the viewpoint of improving the developability and strippability. Using a titration device (for example, Hiranuma Automated Titration Device (COM-555) manufactured by HIRANUMA SANGYO Co., Ltd.), the acid equivalent can be measured by a potentiometric titration method using an aqueous 0.1 mol/L sodium hydroxide solution. The acid equivalent of the alkali-soluble polymer (A) is more preferably 250 to 450, and still more preferably 300 to 440.

The weight-average molecular weight of the alkali-soluble polymer (A) is preferably 5,000 or more and 500,000 or less. It is preferable to adjust the weight-average molecular weight to 5,000 or more from the viewpoint of the properties of the development agglomerate and the properties of the unexposed film, such as edge fusing property and cut chipping property in the photosensitive resin multilayer film, while it is preferable to adjust the weight-average molecular weight to 500,000 or less from the viewpoint of improving the solubility in a developing solution. The edge fusing property is a property which inhibits the phenomenon in which the photosensitive resin composition layer protrudes from the end face of a roll when the photosensitive resin multilayer film is wound into a roll shape. The cut chipping property is a property which inhibits the phenomenon in which chips fly when the unexposed film is cut with a cutter. When the cut chipping property is inferior, the scattered chips adhere to, for example, the upper surface of the photosensitive resin multilayer film, and the chips are transferred to the mask in the subsequent exposure step, thus causing defects leading to problems. The weight-average molecular weight of the alkali-soluble polymer (A) is more preferably 5,000 or more and 300,000 or less, still more preferably 10,000 or more and 200,000 or less, and yet more preferably 25,000 or more and 120,000 or less.

The number of carbon atoms of the alkyl group of the (meth)acrylate, which is the copolymerization component of the alkali-soluble polymer (A), is preferably 4 or more and 12 or less, and more preferably 5 or more and 12 or less, from the viewpoint of improving the properties related to stripped piece dissolution and under-plating.

The (meth)acrylate, which is the copolymerization component of the alkali-soluble polymer (A), may have a linear or branched $C_{3-12}$ alkyl group as the alkyl group having 3 to 12 carbon atoms, and may have, for example, a propyl group, a butyl group, a pentyl group, a hexyl group, a heptyl group, an octyl group, an ethylhexyl group, a nonyl group, a decyl group, a undecyl group, or a dodecyl group. Of these, an alkyl group having 4 to 10 carbon atoms is preferable, an alkyl group having 5 to 10 carbon atoms is more preferable, an alkyl group having 6 to 8 carbon atoms is still more preferable, and a 2-ethylhexyl group is yet more preferable, from the viewpoint of the developing time, and the presence or absence of foot, shape and length of the resist pattern. When the number of carbon atoms of the alkyl group of the (meth)acrylate, which is the copolymerization component of the alkali-soluble polymer (A), is in the above range, the free volume of the photosensitive resin layer becomes large, and thus the developing solution penetrates comparatively easily. Since it becomes easy for the photosensitive resin layer to swell, the developing time tends to be shorten. By using a (meth)acrylate compound having a 2-ethylhexyl group, for example, 2-ethylhexyl (meth)acrylate as a part of the monomer used in the synthesis, the 2-ethylhexyl group is introduced into the alkali-soluble polymer (A), thus making it possible to obtain a copolymer comprising 2-ethylhexyl acrylate as the copolymerization component.

The alkali-soluble polymer (A) preferably has an aromatic hydrocarbon group.

When the alkali-soluble polymer (A) has an aromatic hydrocarbon group, the resolution and adhesion tend to be improved, leading to an improvement in the properties related to stripped piece dissolution and under-plating. By using an aromatic vinyl compound or a (meth)acrylate compound having a benzyl group, for example, benzyl (meth)acrylate as a part of the monomer used in the synthesis, the aromatic hydrocarbon group is introduced into the alkali-soluble polymer (A), thus making it possible to obtain a copolymer comprising benzyl (meth)acrylate as the copolymerization component.

The alkali-soluble polymer (A) can also be obtained by copolymerizing one or more types of monomers from the following two types of monomers.

A first monomer is a carboxylic acid having one polymerizable unsaturated group in the molecule, or acid anhydride thereof. Examples thereof include (meth)acrylic acid, fumaric acid, cinnamic acid, crotonic acid, itaconic acid, maleic anhydride, and maleic acid half-ester. In particular, (meth)acrylic acid is preferable. Here, (meth)acrylic means acrylic or methacrylic.

The copolymerization ratio of the first monomer in the alkali-soluble polymer (A) can be easily calculated from the value of the desired acid equivalent in the alkali-soluble polymer. The copolymerization ratio of the first monomer in the alkali-soluble polymer (A) is preferably 10 to 50% by weight based on the total weight of all monomer components. It is preferable to adjust the copolymerization ratio to 10% by weight or more from the viewpoint of exhibiting satisfactory developability and controlling the edge fusing property. It is preferable to adjust the copolymerization ratio to 50% by weight or less from the viewpoint of improving the resolution and inhibiting the generation of the resist foot. From these viewpoints, the copolymerization ratio of the first monomer is more preferably 20 to 40% by weight, and still more preferably 20 to 30% by weight.

A second monomer is a non-acidic monomer having at least one polymerizable unsaturated group in the molecule. It is possible to use, as the second monomer, the (meth)acrylate compound which has an alkyl group having 3 to 12 carbon atoms described above, for example, n-propyl (meth)acrylate, isopropyl (meth)acrylate, n-butyl (meth)acrylate, isobutyl (meth)acrylate, tert-butyl (meth)acrylate, or 2-ethylhexyl (meth)acrylate, or the (meth)acrylate compound having an aromatic hydrocarbon group described above, for example, benzyl (meth)acrylate.

It is also possible to use, as the second monomer, methyl (meth)acrylate, ethyl (meth)acrylate, 2-hydroxyethyl (meth)acrylate, 2-hydroxypropyl (meth)acrylate, esters of vinyl alcohol; vinyl acetate; (meth)acrylonitrile; or aromatic vinyl compounds.

Examples of the aromatic vinyl compound include styrene and styrene derivatives. Examples of the styrene derivative include oxystyrene, hydroxystyrene, acetoxystyrene, alkylstyrene, and halogenoalkylstyrene.

In the present embodiment, the amount of the alkali-soluble polymer (A) mixed in the photosensitive resin composition is in a range of 10 to 90% by weight, preferably 40 to 80% by weight, and more preferably 50 to 70% by weight, when the total solid component weight of the photosensitive resin composition is 100% by weight. It is advantageous to adjust the mixing amount to 10% by weight or more from the viewpoint of the alkali developability, while it is advantageous to adjust the mixing amount to 90% by weight or less from the viewpoint of controlling the developing time.

<(B) Compound Having Ethylenically Unsaturated Double Bond>

In the present embodiment, the photosensitive resin composition contains, as the compound having an ethylenically unsaturated double bond (B), an acrylate monomer in an amount of 51% by weight to 100% by weight based on the total amount of the compound having an ethylenically unsaturated double bond (B).

When the acrylate monomer accounts for 51 to 100% by weight of the compound having an ethylenically unsaturated double bond (B), the properties related to stripped piece dissolution of the resist pattern tend to be improved as compared with the case where a methacrylate monomer accounts for 51 to 100% by weight. The content of the acrylate monomer is preferably 55% by weight or more, 60% by weight or more, 65% by weight or more, 70% by weight or more, 75% by weight or more, 80% by weight or more, 85% by weight or more or 90% by weight or more, and more preferably 91% by weight or more, based on the total amount of the compound (B) from the viewpoint of improving the plating resistance in addition to the stripped piece dissolubility.

The photosensitive resin composition according to the present embodiment preferably contains, as the compound having an ethylenically unsaturated double bond (B), a trifunctional or higher polyfunctional acrylate group (i.e., three or more acryloyl groups in one molecule)-containing compound. When the photosensitive resin composition contains the trifunctional or higher polyfunctional acrylate group-containing compound as the compound (B), the properties related to stripped piece dissolution and under-plating of the resist pattern tend to be improved, and it is more preferable to use the trifunctional or higher polyfunctional acrylate group-containing compound in combination with the alkali-soluble polymer (A) comprising the (meth)acrylate (A1) and the (meth)acrylate (A2) and/or the vinyl compound (A3) described above as the copolymerization component.

When the trifunctional or higher polyfunctional acrylate group (three or more acryloyl groups in one molecule)-containing compound accounts for 1% by weight or more of the compound having an ethylenically unsaturated double bond, the properties related to stripped piece dissolution and under-plating of the resist pattern tend to be further improved as compared with the case where a compound having three or more acryloyl groups in one molecule accounts for more than 0% by weight and less than 1% by weight of the compound having an ethylenically unsaturated double bond, and the case where the compound having three or more acryloyl groups in one molecule is not contained. From such a viewpoint, the content of the compound having a trifunctional or higher polyfunctional acrylate group is preferably 2% by weight or more, 3% by weight or more, 4% by weight or more, 5% by weight or more, 6% by weight or more, 7% by weight or more, 8% by weight or more, 9% by weight or more or 10% by weight or more, more preferably 20% by weight or more, 40% by weight or more, 60% by weight or more or 80% by weight or more, and can be 100% by weight or 100% by weight or less, based on the total amount of the compound (B).

The compound having a trifunctional or higher polyfunctional acrylate group described above is preferably a compound having an acrylate group in any of trimethylolpropane, pentaerythritol and dipentaerythritol backbones from the viewpoint of the stripped piece dissolubility and plating resistance.

When the photosensitive resin composition contains a compound having an acrylate group in the trimethylolpropane backbone, it is preferable to include, as the trifunctional or higher polyfunctional acrylate group-containing compound, a compound represented by the following general formula (III):

[Chemical Formula 2]

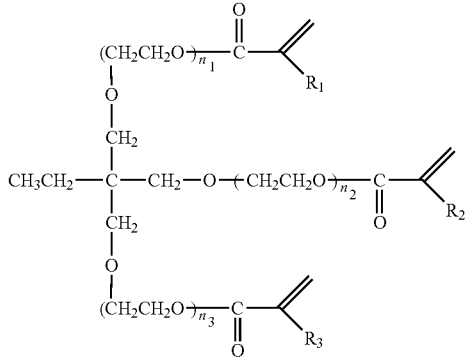

(III)

wherein $n_1$, $n_2$ and $n_3$ are each independently an integer of 1 to 25, in which $n_1+n_2+n_3$ is an integer of 3 to 75, and $R_1$, $R_2$ and $R_3$ are each independently a hydrogen atom.

In the general formula (V), the value of $n_1+n_2+n_3$ is preferably 3 or more and 50 or less. It is preferable to adjust $n_1+n_2+n_3$ to 3 or more from the viewpoint of inhibiting the generation of resist foot, imparting the flexibility to the cured film, and improving the film strength, while it is preferable to adjust $n_1+n_2+n_3$ to 50 or less from the viewpoint of obtaining high resolution and adhesion, and satisfactory stripping properties. $n_1+n_2+n_3$ is more preferably in a range of 6 or more and 40 or less, and still more preferably 9 or more and 30 or less.

Specific examples of the compound represented by the general formula (III) include:
- a triacrylate in which 3 mols on average of ethylene oxide are added to the end of a hydroxyl group of trimethylolpropane,
- a triacrylate in which 9 mols on average of ethylene oxide are added to the end of a hydroxyl group of trimethylolpropane,
- a triacrylate in which 15 mols on average of ethylene oxide are added to the end of a hydroxyl group of trimethylolpropane, and
- a triacrylate in which 30 mols on average of ethylene oxide are added to the end of a hydroxyl group of trimethylolpropane.

When the photosensitive resin composition contains a compound having an acrylate group in the pentaerythritol backbone, it is preferable to include, as the trifunctional or higher polyfunctional acrylate group-containing compound, a compound represented by the following general formula (IV):

[Chemical Formula 3]

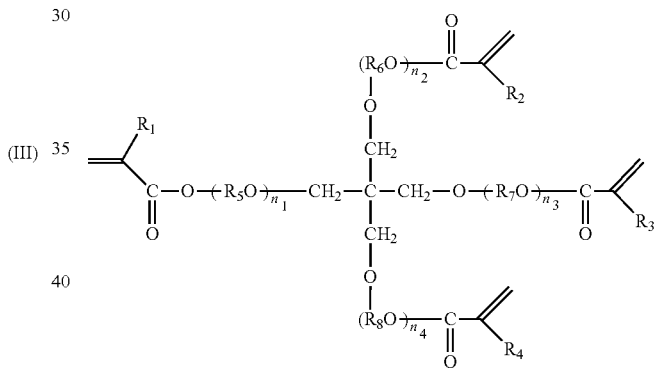

(IV)

wherein $n_1$, $n_2$, $n_3$ and $n_4$ each independently represent an integer of 1 to 25, $n_1+n_2+n_3+n_4$ is an integer of 4 to 100,
$R_1$, $R_2$, $R_3$ and $R_4$ each independently represent a hydrogen atom,
$R_5$, $R_6$, $R_7$ and $R_8$ each independently represent an alkylene group, and when a plurality of $R_5$, $R_6$, $R_7$ and $R_8$ are respectively present, the plurality of $R_5$, $R_6$, $R_7$ and $R_8$ may be the same or different from each other.

In the general formula (IV), $n_1+n_2+n_3+n_4$ is preferably 9 or more and 60 or less. It is preferable to adjust $n_1+n_2+n_3+n_4$ to 9 or more from the viewpoint of inhibiting the generation of resist foot, improving the film strength and imparting the flexibility to the cured film, while it is preferable to adjust $n_1+n_2+n_3+n_4$ to 60 or less from the viewpoint of improving the resolution and adhesion, obtaining satisfactory stripping properties, and controlling the edge fusing property. $n_1+n_2+n_3+n_4$ is more preferably in a range of 16 or more and 60 or less.

$R_5$, $R_6$, $R_7$ and $R_8$ in the general formula (IV) each can be a 1,2-ethylene group, a 1,2-propylene group, or a butylene group, and the 1,2-ethylene group is preferable from the viewpoint of imparting the flexibility to the cured film, inhibiting the development agglomeration property, and enhancing the reactivity of the ethylenically unsaturated double bond. Therefore, the compound represented by the general formula (IV) is preferably a compound represented by the following general formula (V):

[Chemical Formula 4]

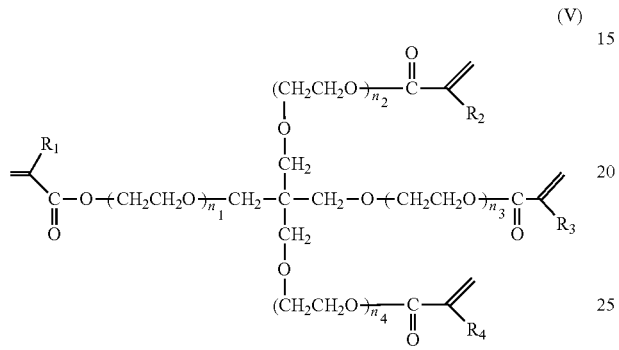

(V)

wherein $n_1$, $n_2$, $n_3$ and $n_4$ are each independently an integer of 1 to 25, in which $n_1+n_2+n_3+n_4$ is an integer of 4 to 100, and $R_1$, $R_2$, $R_3$ and $R_4$ are each independently a hydrogen atom. A preferable range of $n_1+n_2+n_3+n_4$ is the same as mentioned above.

Specific examples of the compound represented by the general formula (IV) include:
- a tetraacrylate in which 4 mols on average of ethylene oxide are added to the end of a hydroxyl group of pentaerythritol,
- a tetraacrylate in which 9 mols on average of ethylene oxide are added to the end of a hydroxyl group of pentaerythritol,
- a tetraacrylate in which 12 mols on average of ethylene oxide are added to the end of a hydroxyl group of pentaerythritol,
- a tetraacrylate in which 15 mols on average of ethylene oxide are added to the end of a hydroxyl group of pentaerythritol,
- a tetraacrylate in which 20 mols on average of ethylene oxide are added to the end of a hydroxyl group of pentaerythritol,
- a tetraacrylate in which 28 mols on average of ethylene oxide are added to the end of a hydroxyl group of pentaerythritol, and
- a tetraacrylate in which 35 mols on average of ethylene oxide are added to the end of a hydroxyl group of pentaerythritol.

When the photosensitive resin composition contains a compound having an acrylate group in the dipentaerythritol backbone, it is preferable to include, as the trifunctional or higher polyfunctional acrylate group-containing compound, a hexaacrylate compound represented by the following general formula (VI):

[Chemical Formula 5]

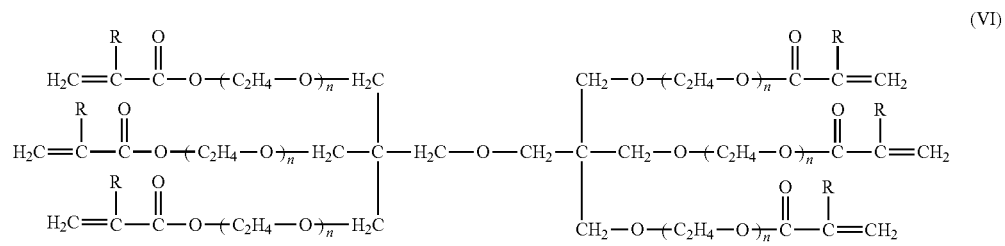

(VI)

wherein R each independently represent a hydrogen atom, and n is an integer of 0 to 30.

In the general formula (VI), since n is an integer of 0 to 30, the presence or absence of the ethylene oxide moiety does not matter.

Preferred specific examples of the hexaacrylate compound represented by the general formula (VI) include dipentaerythritol hexaacrylate, hexaacrylate in which 1 to 36 mols in total of ethylene oxide are added to the six ends of dipentaerythritol, and hexaacrylate in which 1 to 10 mols in total of ε-caprolactone are added to the six ends of pentaerythritol.

The compound according to the present embodiment contains the compound having an acrylate group in any of trimethylolpropane, pentaerythritol and dipentaerythritol backbones described above in an amount of preferably 1% by weight or more, more preferably 10% by weight or more, still more preferably 20% by weight or more, 40% by weight or more or 60% by weight or more, and particularly preferably 80% by weight or more, based on the total amount of the compound (B). When the content of the compound having an acrylate group in any of trimethylolpropane, pentaerythritol and dipentaerythritol backbones is 1% by weight or more based on the total amount of the compound (B), the properties related to stripped piece dissolution and under-plating of the resist pattern tend to be further improved. The upper limit of the content of the compound having an acrylate group in any of trimethylolpropane, pentaerythritol and dipentaerythritol backbones may be, for example, 100% by weight or less or less than 100% by weight based on the total amount of the compound (B).

It is preferable that the compound having an ethylenically unsaturated double bond (B) have an aromatic ring from the viewpoint of further improving the properties related to stripped piece dissolution and under-plating of the resist pattern. The compound having an aromatic ring and an ethylenically unsaturated double bond as the component (B) is preferably a compound having a (meth)acryloyl group at both ends of an alkylene oxide-modified bisphenol A from the viewpoint of the plating resistance, and more preferably a compound represented by the following formula (VII):

stripped piece dissolution and under-plating. $n_1$ and $n_2$ each independently represent an integer of 1 to 100, and preferably $2 \leq n_1+n_2 \leq 200$.

The compound represented by the formula (VII) may include a di(meth)acrylate compound of ethylene glycol in which an alkylene oxide is added to both ends of bisphenol A. Such a di(meth)acrylate compound is preferably a diacrylate or dimethacrylate compound, and more preferably a dimethacrylate compound. Specific examples of the dimethacrylate compound include:

a dimethacrylate of ethylene glycol in which 1 mol on average of ethylene oxide is added to both ends of bisphenol A, a dimethacrylate of ethylene glycol in which 2 mols on average of ethylene oxide are added to both ends of bisphenol A, a dimethacrylate of ethylene glycol in which 5 mols on average of ethylene oxide are added to both ends of bisphenol A, a dimethacrylate of alkylene glycol in which 6 mols on average of ethylene oxide and 2 mols on average of propylene oxide are added to both ends of bisphenol A, and a dimethacrylate of alkylene glycol in which 15 mols on average of ethylene oxide and 2 mols on average of propylene oxide are added to both ends of bisphenol A.

In one embodiment, the photosensitive resin composition may use, as the compound having an ethylenically unsaturated double bond (B), the compound described above, or may further comprise an additional compound (B). It is possible to use, as the additional compound (B), a photopolymerizable ethylenically unsaturated compound. Examples of such a photopolymerizable ethylenically unsaturated compound include a compound having one ethylenic double bond, a compound having two ethylenically unsaturated double bonds, and a compound having three or more ethylenically unsaturated double bonds.

Examples of the compound having one ethylenic double bond include:

a compound in which (meth)acrylic acid is added to one end of a polyalkylene oxide; and

[Chemical Formula 6]

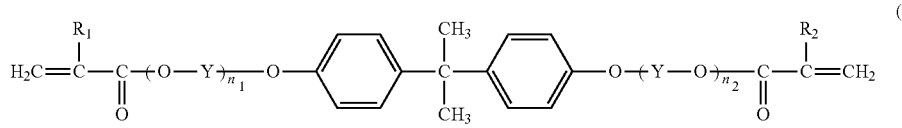

wherein Y each independently represents an alkylene group having 2 to 10 carbon atoms, $R_1$ and $R_2$ each independently represent a methyl group or a hydrogen atom, and $n_1$ and $n_2$ each independently represent an integer of 1 to 100, from the viewpoint of further improving the properties related to stripped piece dissolution and under-plating.

In the formula (VII), it is preferable that Y each independently be an alkylene group having 2 to 4 carbon atoms, and the (Y—O) moiety can also be a random, alternating or block sequence of alkylene oxide repeating units having different number of carbon atoms. $R_1$ and $R_2$ each independently represent a methyl group or a hydrogen atom, and one or both of $R_1$ and $R_2$ are preferably methyl group(s) from the viewpoint of further improving the properties related to a compound in which (meth)acrylic acid is added to one end of a polyalkylene oxide, and the other end is alkyl-etherified or allyl-etherified.

Examples of the compound having two ethylenically unsaturated double bonds in the molecule include:

compounds having a (meth)acryloyl group at both ends of an alkylene oxide chain; and compounds having a (meth)acryloyl group at both ends of a block-bonded alkylene oxide chain in which an ethylene oxide unit and a propylene oxide unit are bonded in random, alternating or blocking manner. Examples of the alkylene oxide modification include ethylene oxide modification, propylene oxide modification, butylene oxide modification, pentylene oxide modification, and hexylene oxide modification. More preferred are compounds having a (meth)acryloyl group at both ends of ethylene oxide-modified bisphenol A. Of these, a diacrylate compound of ethylene glycol in which ethylene oxide is added to both ends of bisphenol A described above is preferable from the viewpoint of the plating resistance.

The compound having three or more ethylenically unsaturated double bonds in the molecule is obtained, for example, by using a compound having three mols or more of a group capable of adding an alkylene oxide group in the molecule as a central backbone, adding an alkyleneoxy group such as an ethyleneoxy group, a propyleneoxy group or a butyleneoxy group to the compound to obtain an alcohol, and converting the alcohol into a (meth)acrylate. In this case, with respect to the compound having three or more ethylenically unsaturated double bonds in the molecule as the additional compound (B), examples of the compound capable of forming the central backbone include glycerin and a compound having an isocyanurate ring. Of these, as the trifunctional glycerin (meth)acrylate which may be modified with an alkylene oxide, preferred is a compound represented by the following formula (VIII):

[Chemical Formula 7]

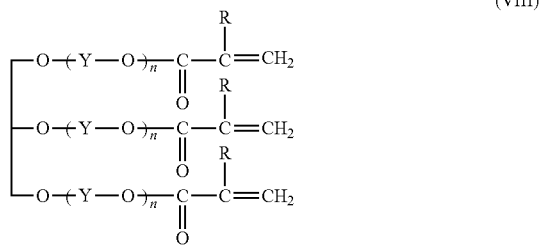

(VIII)

wherein Y each independently represent an alkylene group having 2 to 10 carbon atoms, R each independently represent a methyl group or a hydrogen atom, and n each independently represent an integer of 0 to 200. In the formula (VIII), n is each independently an integer of 0 to 200 and at least one n is preferably an integer of 1 to 200, and three n are more preferably an integer of 1 to 200. Further, the —(Y—O)$_n$— moiety may be a single alkylene oxide repeating unit, or may include a plurality of alkylene oxide units each having different carbon atoms in a random, block or alternating sequence.

The additional compound (B) may be used alone or in combination of two or more thereof.

The amount of the compound having an ethylenically unsaturated double bond (B) mixed in the photosensitive resin composition is 5 to 70% by weight when the total solid component weight of the photosensitive resin composition is 100% by weight. It is based on the viewpoint of improving the sensitivity, resolution and adhesion to adjust the mixing amount to 5% by weight or more, while it is based on the viewpoint of inhibiting edge fusion and inhibiting delay in stripping the cured resist to adjust the mixing amount to 70% by weight or less. The mixing amount is preferably 10 to 50% by weight, and more preferably 20 to 45% by weight.

<(C) Photopolymerization Initiator>

In the present embodiment, the photosensitive resin composition preferably comprises an imidazole compound as the photopolymerization initiator (C). The imidazole compound included in the photosensitive resin composition tends to have plating resistance or inhibit the generation of resist foot in the resist pattern.

Examples of the imidazole compound include:

imidazoles having an aliphatic group, such as methylimidazole, 2-ethyl-4-methylimidazole, 1-isobutyl-2-methylimidazole, 2-ethyl-4-methylimidazole, ethylimidazole, isopropylimidazole, 2,4-dimethylimidazole, undecylimidazole, and heptadecylimidazole; and imidazoles having an aromatic group, such as 1-benzyl-2-methylimidazole, phenylimidazoles (such as 2-phenylimidazole), 2-phenyl-4-methylimidazole, 2-phenyl-4,5-dihydroxymethylimidazole, 2-phenyl-4-methyl-5-hydroxymethylimidazole, triarylimidazole, and dimers thereof. Of these, imidazoles having an aromatic group are preferable, triarylimidazoles (for example, Lophine) or dimers thereof are more preferable, and triarylimidazole dimers are still more preferable, from the viewpoint of the plating resistance and inhibition of the generation of resist foot.

Examples of the triarylimidazole dimer include 2,4,5-triarylimidazole dimers such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer, and 2-(p-methoxyphenyl)-4,5-diphenylimidazole dimer.

The content of the imidazole compound in the photopolymerization initiator (C) is preferably 99% by weight or more and 100% by weight or less based on the total amount of the photopolymerization initiator (C). It is preferable to adjust this content to 99 to 100% by weight based on the total amount of the photopolymerization initiator (C) from the viewpoint of the satisfactory sensitivity, high resolution, and inhibition of agglomeration in the developing solution. From these viewpoints, the imidazole compound can account for 100% by weight of the photopolymerization initiator (C).

In the present embodiment, the photosensitive resin composition may optionally comprise various substances which can be used as the photopolymerization initiator of the photosensitive resin, in addition to the imidazole compound. It is possible to use, as the photopolymerization initiator other than the imidazole compound, for example, aromatic ketones, acridine-based compounds, and/or N-aryl-α-amino acid compounds.

Aromatic ketones are preferable from the viewpoint of improving the sensitivity. Examples of the aromatic ketone include benzophenone, N,N'-tetramethyl-4,4'-dimethylaminobenzophenone (Michler's ketone), N,N'-tetraethyl-4,4'-diaminobenzophenone, 4-methoxy-4'-dimethylaminobenzophenone, 4,4'-bis(diethylamino)benzophenone, and 2-benzyl-2-dimethylamino-1-(4-morpholinophenyl)-butanone-1,2-methyl-1-[4-(methylthio)phenyl]-2-morpholinopropanone-1. Of these, 4,4'-bis(diethylamino)benzophenone is preferable.

The acridine-based compound is preferable from the viewpoint of exhibiting high sensitivity and achieving both high sensitivity and inhibition of the generation of resist foot. Examples of the acridine-based compound include 1,7-bis(9,9'-acridinyl)heptane, 9-phenylacridine, 9-methylacridine, 9-ethylacridine, 9-chloroethylacridine, 9-methoxyacridine, 9-ethoxyacridine, 9-(4-methylphenyl)acridine, 9-(4-ethylphenyl)acridine, 9-(4-n-propylphenyl)acridine, 9-(4-n-butylphenyl)acridine, 9-(4-tert-butylphenyl)acridine, 9-(4-methoxyphenyl)acridine, 9-(4-ethoxyphenyl)acridine, 9-(4-acetylphenyl)acridine, 9-(4-dimethylaminophenyl)

acridine, 9-(4-chlorophenyl)acridine, 9-(4-bromophenyl) acridine, 9-(3-methylphenyl)acridine, 9-(3-tert-butylphenyl) acridine, 9-(3-acetylphenyl)acridine, 9-(3-dimethylaminophenyl)acridine, 9-(3-diethylaminophenyl) acridine, 9-(3-chlorophenyl)acridine, 9-(3-bromophenyl) acridine, 9-(2-pyridyl)acridine, 9-(3-pyridyl)acridine, and 9-(4-pyridyl)acridine. Of these, 1,7-bis(9,9'-acridinyl)heptane or 9-phenylacridine is preferable in terms of the sensitivity, resolution, and availability.

The N-aryl-α-amino acid compound is preferable from the viewpoint of improving the sensitivity. Examples of the N-aryl-α-amino acid compound include N-phenylglycine, N-methyl-N-phenylglycine, and N-ethyl-N-phenylglycine.

Examples of the photopolymerization initiator other than the imidazole compound include: quinones such as 2-ethylanthraquinone, phenanthrenequinone, 2-tert-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone and 2,3-dimethylanthraquinone;

benzoin ether compounds such as benzoin methyl ether, benzoin ethyl ether and benzoin phenyl ether;
benzyl derivatives such as benzyl methyl ketal;
coumarin-based compounds;
pyrazoline derivatives such as 1-phenyl-3-(4-tert-butyl-styryl)-5-(4-tert-butyl-phenyl)-pyrazoline, 1-phenyl-3-(4-biphenyl)-5-(4-tert-butyl-phenyl)-pyrazoline, and 1-phenyl-3-(4-biphenyl)-5-(4-tert-octyl-phenyl)-pyrazoline.

The photopolymerization initiator (C) may be used alone or in combination of two or more thereof.

The amount of the photopolymerization initiator (C) mixed in the photosensitive resin composition is 0.01 to 20% by weight when the total solid component weight of the photosensitive resin composition is 100% by weight. It is based on the viewpoint of obtaining an exposure pattern having a sufficient residual film ratio after development to adjust the mixing amount to 0.01% by weight or more, while it is based on the viewpoint of sufficiently transmitting light to the bottom surface of the resist to obtain high resolution and inhibiting the development agglomeration property in a developing solution to adjust the mixing amount to 20% by weight or less. The range of the mixing amount is preferably in a range of 0.3 to 10% by weight, and more preferably 1 to 5% by weight.

<Leuco Dyes, Fluoran Dyes, Coloring Substances>

The photosensitive resin composition according to the present invention may comprise one or more selected from leuco dyes, fluoran dyes and coloring substances. When the photosensitive resin composition comprises these components, the exposed portion is colored. Therefore, it is preferable in terms of the visibility. Further, when an inspection machine reads an alignment marker for exposure, it is advantageous in that contrast between the exposed portion and the unexposed portion increases and thus becomes easy to recognize.

Examples of the leuco dye include tris(4-dimethylaminophenyl)methane [Leuco Crystal Violet] and bis(4-dimethylaminophenyl)phenylmethane [Leuco Malachite Green]. It is particularly preferable to use Leuco Crystal Violet as the leuco dye from the viewpoint of improving the contrast.

Examples of the fluoran dye include 2-(dibenzylamino) fluoran, 2-anilino-3-methyl-6-diethylaminofluoran, 2-anilino-3-methyl-6-dibutylaminofluoran, 2-anilino-3-methyl-6-N-ethyl-N-isoamylaminofluoran, 2-anilino-3-methyl-6-N-methyl-N-cyclohexylaminofluoran, 2-anilino-3-chloro-6-diethylaminofluoran, 2-anilino-3-methyl-6-N-ethyl-N-isobutylaminofluoran, 2-anilino-6-dibutylaminofluoran, 2-anilino-3-methyl-6-N-ethyl-N-tetrahydrofurfurylaminofluoran, 2-anilino-3-methyl-6-piperidinoaminofluoran, 2-(o-chloroanilino)-6-diethylaminofluoran, and 2-(3,4-dichloroanilino)-6-diethylaminofluoran.

The content of the leuco dye or the fluoran dye in the photosensitive resin composition is preferably 0.1 to 10% by weight when the total solid component weight of the photosensitive resin composition is 100% by weight. It is preferable to adjust the content to 0.1% by weight or more from the viewpoint of improving the contrast between the exposed portion and the unexposed portion. This content is more preferably 0.2% by weight or more, and still more preferably 0.3% by weight or more. On the other hand, it is preferable to adjust the content to 10% by weight or less from the viewpoint of maintaining the storage stability of the photosensitive resin composition and inhibiting the generation of agglomerates during development. This content is more preferably 5% by weight or less, and still more preferably 1% by weight or less.

Examples of the coloring substance include fuchsin, Phthalocyanine Green, Auramine base, paramagenta, Crystal Violet, Methyl Orange, Nile Blue 2B, Malachite Green (AIZEN® MALACHITE GREEN manufactured by Hodogaya Chemical Co., Ltd.), and Basic Blue 7 (for example, AIZEN® Victoria Pure Blue BOH conc.), Basic Blue 20, and Diamond Green (AIZEN® DIAMOND GREEN GH manufactured by Hodogaya Chemical Co., Ltd.).

The content of the coloring substance in the photosensitive resin composition is preferably 0.001% by weight to 1% by weight when the total solid component weight of the photosensitive resin composition is 100% by weight. It is preferable to adjust the content to 0.001% by weight or more from the viewpoint of improving the handleability, while it is preferable to adjust the content to 1% by weight or less from the viewpoint of maintaining the storage stability.

<Halogen Compound>

In the photosensitive resin composition of the present embodiment, it is a preferable aspect to use the leuco dye in combination with the following halogen compound from the viewpoint of the adhesion and contrast.

Examples of the halogen compound include amyl bromide, isoamyl bromide, isobutylene bromide, ethylene bromide, diphenylmethyl bromide, benzyl bromide, methylene bromide, tribromomethylphenyl sulfone, carbon tetrabromide, tris(2,3-dibromopropyl)phosphate, trichloroacetamide, amyl iodide, isobutyl iodide, 1,1,1-trichloro-2,2-bis(p-chlorophenyl)ethane, and chlorinated triazine compounds. Particularly, tribromomethylphenyl sulfone is preferable. A halogen compound such as tribromomethylphenyl sulfone is highly effective when used in combination with acridine-based compounds, and it is preferable from the viewpoint of improving the resolution, improving the adhesion, improving the sensitivity, improving the contrast, improving tenting film thrust resistance, inhibiting the generation of resist foot, and improving the etching resistance.

The content of the halogen compound in the photosensitive resin composition is preferably 0.01% by weight when the total solid component weight of the photosensitive resin composition is 100% by weight, from the above viewpoints. This content is more preferably 0.1% by weight or more, still more preferably 0.3% by weight or more, and particularly preferably 0.5% by weight or more. Further, it is preferable that the content be 3% by weight or less from the viewpoint of maintaining the storage stability of the hue in the photosensitive layer, and inhibiting the generation of agglomerates during development. This content is more preferably 2% by weight or less, and still more preferably 1.5% by weight or less.

<Radical Polymerization Inhibitors, Benzotriazoles, Carboxybenzotriazoles>

In the present embodiment, in order to improve the thermal stability and storage stability of the photosensitive resin composition, the photosensitive resin composition may further comprise at least one compound selected from the group consisting of radical polymerization inhibitors, benzotriazoles and carboxybenzotriazoles.

Examples of the radical polymerization inhibitor include p-methoxyphenol, hydroquinone, pyrogallol, naphthylamine, tert-butylcatechol, biphenol, cuprous chloride, 2,6-di-tert-butyl-p-cresol, 2,2'-methylenebis(4-methyl-6-tert-butylphenol), 2,2'-methylenebis(4-ethyl-6-tert-butylphenol), 4,4'-thiobis(6-tert-butyl-m-cresol), 4,4'-butylidenebis(3-methyl-6-tert-butylphenol), 1,1,3-tris(2-methyl-4-hydroxy-5-tert-butylphenyl)butane, styrenated phenol (for example, trade name "ANTAGE SP" manufactured by Kawaguchi Chemical Industry Co., LTD.), tribenzylphenol (for example, trade name "TBP", phenol compound having 1 to 3 benzyl groups manufactured by Kawaguchi Chemical Industry Co., LTD.), and diphenylnitrosamine.

Examples of benzotriazoles include 1,2,3-benzotriazole, 1-chloro-1,2,3-benzotriazole, bis(N-2-ethylhexyl)aminomethylene-1,2,3-benzotriazole, bis(N-2-ethylhexyl)aminomethylene-1,2,3-tolyltriazole, and bis(N-2-hydroxyethyl)aminomethylene-1,2,3-benzotriazole.

Examples of carboxybenzotriazoles include 4-carboxy-1,2,3-benzotriazole, 5-carboxy-1,2,3-benzotriazole, N—(N,N-di-2-ethylhexyl)aminomethylenecarboxybenzotriazole, N—(N,N-di-2-hydroxyethyl)aminomethylenecarboxybenzotriazole, N—(N,N-di-2-ethylhexyl)aminoethylenecarboxybenzotriazole, and mixtures thereof. Of these, a 1:1 mixture of 4-carboxy-1,2,3-benzotriazole and 5-carboxy-1,2,3-benzotriazole is preferable.

The total content of the radical polymerization inhibitor, benzotriazoles and carboxybenzotriazoles is preferably 0.01 to 3% by weight, and more preferably 0.05 to 1% by weight, when the total solid component weight of the photosensitive resin composition is 100% by weight. It is preferable to adjust the content to 0.01% by weight or more from the viewpoint of imparting the storage stability to the photosensitive resin composition, while it is preferable to adjust the content to 3% by weight or less from the viewpoint of maintaining the sensitivity and inhibiting decolorization of the dye.

<Plasticizer>

The photosensitive resin composition of the present embodiment may optionally comprise a plasticizer. Examples of this plasticizer include glycol esters such as polyethylene glycol, polypropylene glycol, polyoxypropylene polyoxyethylene ether, polyoxyethylene monomethyl ether, polyoxypropylene monomethyl ether, polyoxyethylene polyoxypropylene monomethyl ether, polyoxyethylene monoethyl ether, polyoxypropylene monoethyl ether and polyoxyethylene polyoxypropylene monoethyl ether;

phthalic acid esters such as diethyl phthalate;

o-toluenesulfonic acid amide, p-toluenesulfonic acid amide, tributyl citrate, triethyl citrate, triethyl acetylcitrate, tri-n-propyl acetylcitrate, and tri-n-butyl acetylcitrate;

propylene glycol in which propylene oxide is added to both ends of bisphenol A, and ethylene glycol in which ethylene oxide is added to both ends of bisphenol A; and an aluminum salt to which 1 to 3 mols of nitrosophenylhydroxylamine are added. These plasticizers can be used alone on in combination of two or more thereof.

Particularly, aluminum salt to which 3 mols of nitrosophenylhydroxylamine are added is preferable as plasticizers from the viewpoint of the stripped piece dissolubility or plating resistance.

The content of the plasticizer in the photosensitive resin composition is preferably 1 to 50% by weight, and more preferably 1 to 30% by weight, when the total solid component weight of the photosensitive resin composition is 100% by weight. It is preferable to adjust the content to 1% by weight or more from the viewpoint of inhibiting developing time delay and imparting the flexibility to the cured film, while it is preferable to adjust the content to 50% by weight or less from the viewpoint of inhibiting insufficient curing and edge fusion.

<Solvent>

The photosensitive resin composition can be used as a solution after dissolving in a solvent. Examples of the solvent used include ketones typified by methyl ethyl ketone (MEK); and alcohols typified by methanol, ethanol and isopropanol. The solvent is preferably added to the photosensitive resin composition so that the viscosity of the solution of the photosensitive resin composition applied on the support film is 500 to 4,000 mPas at 25° C.

<Properties of Photosensitive Resin Composition>

The photosensitive resin composition of the present embodiment satisfies a relationship represented by the following inequality (I):

$$0 < A/T \le 0.007 \quad \text{Inequality (I)}$$

where T (μm) is a thickness of a photosensitive resin layer containing the photosensitive resin composition, and A is an absorbance of the photosensitive resin layer containing the photosensitive resin composition at a wavelength of 365 nm. The photosensitive resin composition satisfying a relationship represented by the inequality (I) easily improves the properties related to stripped piece dissolution or under-plating of the resist pattern as compared with the photosensitive resin composition satisfying the inequality: A/T>0.007. The photosensitive resin composition preferably satisfies a relationship represented by the inequality (II):

$$0 < A/T \, 0.005 \quad \text{Inequality (II)}$$

where T (μm) is a thickness of a photosensitive resin layer containing the photosensitive resin composition, and A is an absorbance of the photosensitive resin layer containing the photosensitive resin composition at a wavelength of 365 nm, from the viewpoint of further improving the properties related to stripped piece dissolution or under-plating of the resist pattern. From the same viewpoint, the A/T value of the photosensitive resin composition is more preferably more than 0 and less than 0.005, and still more preferably more than 0 and 0.004 or less.

<Photosensitive Resin Multilayer Film>

In another aspect of the present invention, a photosensitive resin multilayer film can be formed by using the photosensitive resin composition described above. The photosensitive resin multilayer film according to this embodiment is preferably a dry film resist. Typically, the photosensitive resin multilayer film comprises a support film and a layer of the photosensitive resin composition laminated on the support film. The photosensitive resin multilayer film may optionally comprise a protective layer on the surface opposite to the support film side.

The photosensitive resin multilayer film according to the present embodiment satisfies a relationship represented by the following formula (I):

$$0 < A/T \leq 0.007 \qquad \text{Inequality (I)}$$

where T (μm) is a thickness of a photosensitive resin layer containing the photosensitive resin composition, and A is an absorbance of the photosensitive resin layer containing the photosensitive resin composition at a wavelength of 365 nm. The photosensitive resin composition satisfying a relationship represented by the inequality (I) tends to improve the properties related to stripped piece dissolution or under-plating of the resist pattern as compared with the photosensitive resin composition satisfying the inequality: $A/T > 0.007$.

The photosensitive resin composition preferably satisfies a relationship represented by the inequality (II):

$$0 < A/T \leq 0.005 \qquad \text{Inequality (II)}$$

where T (μm) is a thickness of a photosensitive resin layer containing the photosensitive resin composition, and A is an absorbance of the photosensitive resin layer containing the photosensitive resin composition at a wavelength of 365 nm, from the viewpoint of further improving the properties related to stripped piece dissolution or under-plating of the resist pattern. From the same viewpoint, the A/T value of the photosensitive resin multilayer film is more preferably more than 0 and less than 0.005, and still more preferably more than 0 and 0.004 or less.

As the support film, a transparent film which transmits light emitted from an exposure light source is desirable. Examples of such a support film include a polyethylene terephthalate film, a polyvinyl alcohol film, a polyvinyl chloride film, a vinyl chloride copolymer film, a polyvinylidene chloride film, a vinylidene chloride copolymer film, a methyl polymethacrylate copolymer film, a polystyrene film, a polyacrylonitrile film, a styrene copolymer film, a polyamide film, and a cellulose derivative film. It is also possible to use films obtained by optionally stretching these films.

The haze of the support film is preferably 5 or less.

The smaller the thickness of the support film is, the more advantageous it becomes in terms of the image forming property and economy, but the thickness is preferably 10 to 30 μm in consideration of the function of maintaining the strength.

The layer of the photosensitive resin composition described above may contain or consist of the photosensitive resin composition. The thickness of the layer of the photosensitive resin composition in the photosensitive resin multilayer film is preferably 40 μm or more and 600 μm or less, more preferably 50 to 400 μm, still more preferably more than 50 μm and 400 μm or less, yet more preferably 100 to 400 μm, and particularly preferably 200 to 400 μm, from the viewpoint of the thickness suitable for plating applications.

Important properties of the protective layer used in the photosensitive resin multilayer film are those having appropriate adhesion. In other words, it is preferable that the adhesive force of the protective layer to the photosensitive resin layer be sufficiently smaller than that of the support film to the photosensitive resin layer, and that the protective layer can be easily stripped from the photosensitive resin multilayer film. It is possible to use, as the protective layer, for example, a polyethylene film, a polypropylene film, or a film having excellent strippability shown in JP 59-202457 A. The thickness of the protective layer is preferably 10 to 100 μm, and more preferably 10 to 50 μm.

<Method for Fabricating Photosensitive Resin Multilayer Film>

The photosensitive resin multilayer film can be fabricated by sequentially laminating a photosensitive resin layer, and optionally a protective layer, on a support film. It is possible to use, as the method, known methods. For example, the photosensitive resin composition used for the photosensitive resin layer is mixed and dissolved with a solvent to obtain a uniform solution-like coating liquid. Then, the coating liquid can be applied onto the support film using a bar coater or a roll coater, and then dried to laminate a photosensitive resin layer made of a photosensitive resin composition on the support film. Then, a photosensitive resin multilayer film can be produced by optionally laminating a protective layer on the photosensitive resin layer.

<Method for Forming Resist Pattern>

Another embodiment of the present invention provides a method for forming a resist pattern, comprising:

a step of laminating the above-mentioned photosensitive resin multilayer film of the present disclosure on a substrate (laminating step), a step of exposing the laminated photosensitive resin multilayer film (exposure step); and a step of developing the exposed photosensitive resin multilayer film (development step).

<Method for Forming Semiconductor Bump>

Still another embodiment of the present invention provides a method for forming a semiconductor bump, comprising:

a step of subjecting a substrate on which a resist pattern is formed by the above-mentioned method for forming a resist pattern to copper plating or solder plating (plating step).

Optionally, the method for forming a semiconductor bump can further comprise a step of etching the substrate on which the resist pattern is formed.

Optionally, a descumming and plating pretreatment step can be carried out before the plating step in the method for forming a semiconductor bump.

Optionally, the method for forming a semiconductor bump can further comprise a stripping step of stripping the resist pattern from the substrate after the series of steps mentioned above.

Hereinafter, an example of the method for forming a resist pattern and a semiconductor bump using a photosensitive resin multilayer film and a sputtered copper thin film as a base material will be described.

(1) Lamination Step

The laminating step is a step of adhering a photosensitive resin multilayer film on a substrate such as a sputtered copper thin film using, for example, a hot roll laminator while stripping a protective layer from the photosensitive resin multilayer film. The sputtered copper thin film used in the lamination step is preferably a copper sputtered silicon wafer in which a copper layer is formed on a silicon wafer by a sputtering apparatus.

(2) Exposure Step

The exposure step can be, for example:

a step of exposing through a mask film having a desired wiring pattern in a state where the mask film is adhered to a photosensitive resin layer of the photosensitive resin multilayer film laminated on the substrate, a step of exposing the desired wiring pattern by a direct imaging exposure method, or a step of exposing a photomask image by an exposure method of projecting through a lens.

(3) Development Step

After the exposure step, a support film on the photosensitive resin layer is stripped, and then the unexposed portion (in the case of negative-type) or the exposed portion (in the case of positive-type) is developed with a developing solution of an aqueous alkaline solution, and then removed to form a resist pattern on the substrate.

It is possible to use, as the aqueous alkaline solution, an aqueous solution of $Na_2CO_3$ or $K_2CO_3$. The aqueous alkaline solution is appropriately selected according to the properties of the photosensitive resin layer, but it is preferable to use an aqueous $Na_2CO_3$ solution having the concentration of about 0.2 to 2% by weight at about 20 to 40° C.

A resist pattern can be obtained through each of the above steps. In some cases, after these steps, a heating step may be further carried out at about 100° C. to 300° C. for 1 minute to 5 hours. By carrying out this heating step, it is possible to further improve the adhesion and chemical resistance of the obtained cured resist pattern. For heating in this case, it is possible to use, for example, a hot air, infrared ray or far infrared ray-type heating furnace.

Figure 2:
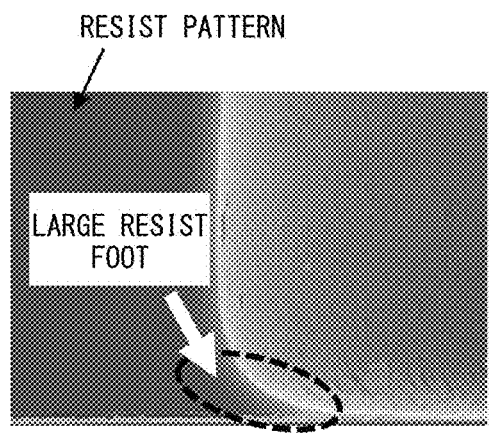
FIG. 2 is a SEM photograph showing an example of a large resist foot (a) and large under-plating (b).
Figure 2:
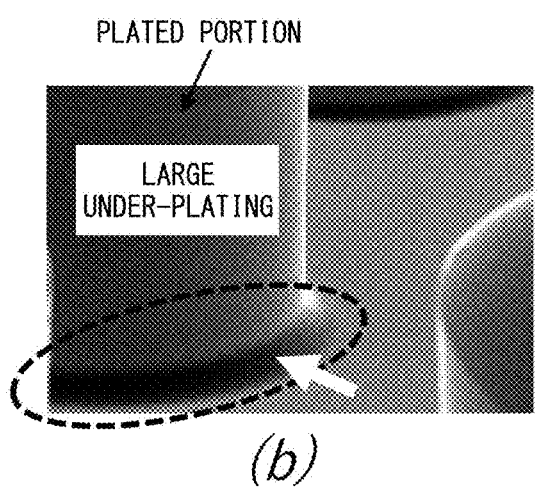

Regarding the obtained resist pattern, an example of a small resist foot is shown in FIG. 1(*a*), and an example of a large resist foot is shown in FIG. 2(*a*).

(Descumming and Plating Pretreatment Step)

Optionally, the substrate on which the resist pattern is formed can be subjected to a plasma treatment and/or a water immersion treatment to carry out a descumming and plating pretreatment.

(4) Plating Step

A conductor pattern can be produced by subjecting the surface of the substrate exposed by development (for example, copper surface of a sputtered copper thin film) to copper plating or solder plating. The plating solution is preferably a copper sulfate plating solution.

An example of small under-plating is shown in FIG. 1(*b*), and an example of large under-plating is shown in FIG. 2(*b*).

(Etching Step)

Optionally, the resist pattern formed through the above steps may be sprayed with an etching solution from above to etch the copper surface which is not covered with the resist pattern, thus forming a circuit pattern. Examples of the etching method include acid etching and alkaline etching, and etching is carried out by the method suited for the photosensitive resin multilayer film to be used.

(Stripping Step)

Thereafter, the multilayer film is treated with an aqueous solution having a stronger alkalinity than that of the developing solution, and the resist pattern is stripped from the substrate. The stripping solution is preferably at least one selected from the group consisting of an aqueous solution of NaOH or KOH having the concentration of about 2 to 5% by weight and a temperature of about 40 to 70° C.; SPR920 (product name); and R-101 (product name). A small amount of water-soluble solvent may be added to the stripping solution.

The photosensitive resin composition, the photosensitive resin multilayer film, the resist pattern and the semiconductor bump described above can be used, for example, for forming a semiconductor package.

EXAMPLES

Examples of embodiments of the present invention will be specifically described below by way of the Examples and Comparative Examples.

First, a method for fabricating evaluation samples of Examples and Comparative Examples will be described, and then an evaluation method and evaluation results for the obtained samples will be shown.

Examples 1 to 13 and Comparative Examples 1 to 4

First, a method for fabricating evaluation samples of the Examples and Comparative Examples will be described, and then an evaluation method for the obtained samples and evaluation results thereof will be shown.

1. Fabrication of Evaluation Samples

The evaluation samples in the Examples and Comparative Examples were fabricated as follows.

<Fabrication of Photosensitive Resin Multilayer Film>

The photosensitive resin composition and solvent with the composition shown in Table 1 below (the numbers of each component indicate the mixing amount (parts by weight) as a solid component) are well stirred and mixed to prepare a photosensitive resin composition formulation, which was uniformly applied onto the surface of a 16 μm-thick polyethylene terephthalate film (FB-40, manufactured by Toray Industries, Inc.) as a support using a bar coater, and then dried in a dryer at 95° C. for 12 minutes to form a photosensitive resin layer. The thickness (T) of the photosensitive resin layer was 240 μm.

Next, a 19 μm-thick polyethylene film (GF-18 manufactured by Tamapoly Co., Ltd.) was laminated as a protective layer on the surface on which the polyethylene terephthalate film of the photosensitive resin layer was not laminated, thus obtaining a photosensitive resin multilayer film. Further, the absorbance (A) of the photosensitive resin multilayer film at a wavelength of 365 nm was measured using an ultraviolet-visible light (UV-Vis) measurement device (U-3010 type spectrophotometer manufactured by Hitachi High-Technologies Corporation), as follows: The polyethylene film of the photosensitive resin multilayer film was stripped and the absorbance at 365 nm was measured, and the obtained value was taken as the absorbance (A). Air was used as a blank sample.

Table 1 below shows the mixing amount and evaluation results in the photosensitive resin composition formulation, and Table 2 below shows the names of the material components in the photosensitive resin composition formulation shown in Table 1.

2. Fabrication of Semiconductor Bumps

<Substrate>

When fabricating a copper post, a copper sputtered silicon wafer, in which a copper layer having a thickness of 2,000 angstroms (angstrom) was formed on a 6-inch silicon wafer by a sputtering device manufactured by ANELVA Corporation, was used.

<Lamination>

While stripping the polyethylene film from a photosensitive resin multilayer film, the photosensitive resin multilayer film was laminated on a silicon wafer preheated to 70° C. by a hot roll laminator (VA-400III manufactured by Taisei Laminator Co., Ltd.) at a roll temperature of 70° C. The air pressure was adjusted to 0.20 MPa, and the laminating speed was adjusted to 0.18 m/min.

<Exposure>

Using a glass chrome mask, exposure was carried out at 300 mJ/cm$^2$ by an Ultratech Prisma ghi stepper (manufactured by Ultratech Co., Ltd.). The illuminance measured on the surface of the substrate was 2,400 mW/cm$^2$.

<Development>

Using a spin developer (AD-1200 manufactured by TAKIZAWA SANGYO K.K.), exposure was carried out by spraying the multilayer film with an aqueous 1% by weight $Na_2CO_3$ solution at 30° C. at a flow rate of 200 mL/min.

<Descumming and Plating Pretreatment>

The descumming and plating pretreatment was carried out by subjecting the evaluation substrate to a plasma treatment under the conditions of 50 Pa, 133 W, $O_2$ at 40 mL/min, $CF_4$ at 1 mL/min using a low pressure plasma device (EXAM manufactured by Shinko Seiki Co., Ltd.), followed by immersion in pure water for 5 minutes.

<Copper Sulfate Plating>

Copper plating was carried out as follows, followed by stripping as described below to prepare a copper post.

To 968 mL of SC-50 MU MA (MICROFAB®), 20 mL of SC-50 $R_1$ (manufactured by the same company) and 12 mL of SC-50 $R_2$ (manufactured by the same company) to fabricate a copper sulfate plating solution. Using HARING CELL uniform plating device (manufactured by Yamamoto Plating Tester Co., Ltd.), the plating resistance evaluation substrate (6 cm×12.5 cm) after subjecting to the plating pretreatment was plated with the fabricated copper sulfate plating solution, adjusting the current value so as to deposit copper at the height of 1 μm per minute. At this time, the thickness of the copper plating film was 100 μm.

<Stripping>

The evaluation substrate subjected to the plating treatment was stripped with a stripping solution of 3% NaOH, SPR920 (manufactured by KANTO-PPC Inc.) and R-101 (manufactured by Mitsubishi Gas Chemical Company, Inc.) by heating at 65° C. for 100 minutes.

3. Evaluation of Minimum Developing Time

The shortest time required for the photosensitive resin layer in the unexposed portion to completely dissolve was measured as "minimum developing time" and ranked as follows:
  S: The minimum developing time was 210 seconds or less;
  A: The minimum developing time was more than 210 seconds and 220 seconds or less;
  B: The minimum developing time was more than 220 seconds and 230 seconds or less;
  C: The minimum developing time was more than 230 seconds.

4. Evaluation of Resist Foot

A 150 μm circular hole was patterned and the descummed substrate was cut, and then the foot length at the bottom of the resist was observed by SEM. The foot length was ranked as follows.
  S: The foot length was 1 μm or less;
  A: The foot length was more than 1 μm and 1.5 μm or less;
  B: The foot length was more than 1.5 μm and 2.0 μm or less;
  C: The foot length was more than 2.0 μm.

5. Evaluation of Plating Resistance

After copper plating, the bottom of the copper post of the substrate from which the cured resist was stripped was observed by SEM and then ranked as follows.
  S: No copper under-plating was observed;
  A: Copper under-plating of 1 μm or less was observed;
  B: Copper under-plating of more than 1 μm and 3 μm or less was observed;
  C: Copper under-plating of more than 3 μm was observed.

6. Evaluation of Stripped Piece Dissolubility

<Exposure>

The photosensitive resin multilayer film was exposed from the support film side to fabricate a cured resist. An Ultratech Prisma ghi stepper (manufactured by Ultratech Co., Ltd.) was used for the exposure. The exposure was carried out at an exposure dose of 300 mJ/cm².

<Development>

The support film was stripped from the exposed photosensitive resin multilayer film, and then development was carried out by spraying with an aqueous 1% by weight $Na_2CO_3$ solution at 30° C. for twice the "minimum developing time". Then, the protective layer was stripped off to obtain a cured resist.

<Evaluation of Stripped Piece Dissolubility 1>

About 50 mg of the obtained cured resist was immersed in 20 mL of a 3% NaOH stripping solution at 65° C. for 75 minutes. Then, the remaining cured film was filtered and vacuum dried, and the weight of the obtained filtrate was divided by the weight of the first immersed cured resist to determine the residual film ratio and evaluate "stripped piece dissolubility". The stripped piece dissolubility was ranked as follows.
  S: The residual film ratio was 0%;
  A: The residual film ratio was more than 0% and 10% or less;
  B: The residual film ratio was more than 10% and 25% or less;
  C: The residual film ratio was more than 25%.

<Evaluation of Stripped Piece Dissolubility 2>

In the above evaluation 1, SPR920 was used as the stripping liquid and the evaluation was carried out in the same manner.
  S: The residual film ratio was 0%;
  A: The residual film ratio was more than 0% and 10% or less;
  B: The residual film ratio was more than 10% and 25% or less;
  C: The residual film ratio was more than 25%.

<Evaluation of Stripped Piece Dissolubility 3>

In the above evaluation 1, R-101 was used as the stripping liquid and the evaluation was carried out in the same manner.
  S: The residual film ratio was 0%;
  A: The residual film ratio was more than 0% and 10% or less;
  B: The residual film ratio was more than 10% and 25% or less;
  C: The residual film ratio was more than 25%.

7. Evaluation of Wrinkle of Dry Film Resist During Storage

The photosensitive resin multilayer film was wound around a plastic bottle having a diameter of 8.5 cm, and after being left to stand under the conditions of 23° C. and 50% RH, the generation degree of wrinkles on the resist surface was evaluated and then ranked as follows.
  S: No wrinkle was generated after 12 hours or more;
  A: Wrinkles were generated after more than 6 hours and within 12 hours;
  B: Wrinkles were generated after more than 3 hours and within 6 hours;
  C: Wrinkles were generated within 3 hours.

TABLE 1

|  |  | Example 1 | Example 2 | Example 3 | Example 4 | Example 5 | Example 6 | Example 7 | Example 8 | Example 9 |
|---|---|---|---|---|---|---|---|---|---|---|
| Binder | A-1 | 20 |  | 20 | 20 |  |  | 20 | 20 |  |
|  | A-2 | 40 | 60 |  |  |  |  |  |  |  |
|  | A-3 |  |  | 40 | 40 | 60 | 60 | 40 | 40 | 60 |
|  | A-4 |  |  |  |  |  |  |  |  |  |
| Monomer | B-1 | 35 | 35 | 35 | 32 | 35 | 24 |  |  |  |
|  | B-2 |  |  |  |  |  |  | 35 |  |  |
|  | B-3 |  |  |  |  |  |  |  | 35 |  |
|  | B-4 |  |  |  |  |  |  |  |  | 35 |
|  | B-5 |  |  |  | 3 |  |  |  |  |  |
|  | B-6 |  |  |  |  |  | 11 |  |  |  |
|  | B-7 |  |  |  |  |  |  |  |  |  |
| Initiator | I-1 | 3 | 3 | 3 | 3 | 3 | 3 | 3 | 3 | 3 |
|  | I-2 | 0.01 | 0.01 | 0.01 | 0.01 | 0.01 | 0.01 | 0.01 | 0.01 | 0.01 |
| Dye | D-1 | 0.4 | 0.4 | 0.4 | 0.4 | 0.4 | 0.4 | 0.4 | 0.4 | 0.4 |
|  | D-2 | 0.01 | 0.01 | 0.01 | 0.01 | 0.01 | 0.01 | 0.01 | 0.01 | 0.01 |
| Auxiliary adhesion agent | A-1 | 0.005 | 0.005 | 0.005 | 0.005 | 0.005 | 0.005 | 0.005 | 0.005 | 0.005 |
| Plasticizer | S-1 | 0.02 | 0.02 | 0.02 | 0.02 | 0.02 | 0.02 | 0.02 | 0.02 | 0.02 |
| Total % by weight |  | 98.445 | 98.445 | 98.445 | 98.445 | 98.445 | 98.445 | 98.445 | 98.445 | 98.445 |
| Absorbance A @ 365 nm |  | 0.96 | 0.96 | 0.96 | 0.96 | 0.96 | 0.96 | 0.96 | 0.96 | 0.96 |
| Thickness T [μm] |  | 240 | 240 | 240 | 240 | 240 | 240 | 240 | 240 | 240 |
| A/T |  | 0.004 | 0.004 | 0.004 | 0.004 | 0.004 | 0.004 | 0.004 | 0.004 | 0.004 |
| Effect | Minimum developing time | S | S | A | A | A | A | A | A | A |
|  | Evaluation of resist foot | S | S | A | A | A | A | A | A | A |
|  | Plating resistance | S | S | S | A | S | A | A | A | A |
|  | Stripped piece dissolubility 1 | S | S | S | A | S | S | A | A | A |
|  | Stripped piece dissolubility 2 | S | S | S | A | S | S | A | A | A |
|  | Stripped piece dissolubility 3 | S | S | S | A | S | S | A | A | A |
|  | Evaluation of wrinkle of dry film resist during storage | S | A | A | A | A | A | A | A | A |

|  |  | Example 10 | Comparative Example 1 | Comparative Example 2 | Example 11 | Example 12 | Comparative Example 3 | Example 13 | Comparative Example 4 |
|---|---|---|---|---|---|---|---|---|---|
| Binder | A-1 |  |  |  | 60 |  |  |  |  |
|  | A-2 |  |  |  |  | 60 | 60 | 60 |  |
|  | A-3 | 60 |  |  |  |  |  |  | 60 |
|  | A-4 |  |  | 60 |  |  |  |  |  |
| Monomer | B-1 | 35 |  |  |  |  |  | 3 | 35 |
|  | B-2 |  | 35 | 35 |  |  |  |  |  |
|  | B-3 |  |  |  |  |  |  |  |  |
|  | B-4 |  |  |  |  |  |  |  |  |
|  | B-5 |  |  |  |  |  |  | 35 |  |
|  | B-6 |  |  |  | 35 |  |  |  |  |
|  | B-7 |  |  |  |  | 35 | 32 |  |  |
| Initiator | I-1 | 3 | 3 | 3 | 3 | 3 | 3 | 3 | 3 |
|  | I-2 | 0.03 | 0.01 | 0.01 | 0.01 | 0.01 | 0.01 | 0.01 | 0.05 |
| Dye | D-1 | 0.4 | 0.4 | 0.4 | 0.4 | 0.4 | 0.4 | 0.4 | 0.4 |
|  | D-2 | 0.01 | 0.01 | 0.01 | 0.01 | 0.01 | 0.01 | 0.01 | 0.01 |
| Auxiliary adhesion agent | A-1 | 0.005 | 0.005 | 0.005 | 0.005 | 0.005 | 0.005 | 0.005 | 0.005 |

TABLE 1-continued

| | | | | | | | | | |
|---|---|---|---|---|---|---|---|---|---|
| Plasticizer | S-1 | 0.02 | 0.02 | 0.02 | 0.02 | 0.02 | 0.02 | 0.02 | 0.02 |
| Total % by weight | | 98.465 | 98.445 | 98.445 | 98.445 | 98.445 | 98.445 | 98.445 | 98.485 |
| Absorbance A @ 365 nm | | 1.54 | 0.96 | 0.96 | 0.96 | 0.96 | 0.96 | 0.96 | 2.12 |
| Thickness T [μm] | | 240 | 240 | 240 | 240 | 240 | 240 | 240 | 240 |
| A/T | | 0.006 | 0.004 | 0.004 | 0.004 | 0.004 | 0.004 | 0.004 | 0.009 |
| Effect | Minimum developing time | A | C | C | A | S | A | S | A |
| | Evaluation of resist foot | A | C | C | A | A | A | A | A |
| | Plating resistance | B | B | B | C | C | B | C | C |
| | Stripped piece dissolubility 1 | S | A | A | B | A | C | C | S |
| | Stripped piece dissolubility 2 | S | A | A | B | A | C | C | S |
| | Stripped piece dissolubility 3 | S | A | A | B | A | C | C | S |
| | Evaluation of wrinkle of dry film resist during storage | A | A | A | A | A | A | A | A |

TABLE 2

| | |
|---|---|
| A-1 | 50% (solid content) MEK solution of a copolymer having the composition of methacrylic acid/benzyl methacrylate (polymerization ratio is 20/80), an acid equivalent of 430 and a weight-average molecular weight of 25,000 |
| A-2 | 54% (solid content) MEK solution of a copolymer having the composition of methacrylic acid/benzyl methacrylate/2-ethylhexyl acrylate (polymerization ratio is 25/55/20), an acid equivalent of 344 and a weight-average molecular weight of 60,000 |
| A-3 | 36% MEK solution of a copolymer having the composition of methyl methacrylate/methacrylic acid/n-butyl acrylate (polymerization weight ratio is 65/25/10), an acid equivalent of 344 and a weight-average molecular weight of 120,000 |
| A-4 | 35% MEK solution of a copolymer having the composition of methyl methacrylate/methacrylic acid/styrene (polymerization ratio is 50/25/25), an acid equivalent of 344 and a weight-average molecular weight of 50,000 |
| B-1 | Tetraacrylate in which 4 mol on average of ethylene oxide is added to pentaerythritol |
| B-2 | Triacrylate in which 3 mol on average of ethylene oxide is added to trimethylolpropane |
| B-3 | Hexaacrylate having 6 mol on average of an acrylate in dipentaerythritol |
| B-4 | Tetraacrylate in which 15 mol on average of ethylene oxide is added to pentaerythritol |
| B-5 | Dimethacrylate in which 1 mol of ethylene oxide is added to both ends of bisphenol A |
| B-6 | Monoacrylate in which 6 mol on average of ethylene oxide is added to phenol |
| B-7 | Nonaethylene glycol diacrylate |
| I-1 | 2-(o-Chlorophenyl)-4,5-diphenylimidazolyl dimer |
| I-2 | 4,4'-Bis(diethylamino)benzophenone |
| D-1 | Leuco Crystal Violet |
| D-2 | AIZEN Victoria Pure Blue BOH conc. |
| A-1 | 1:1 Mixture of 4-carboxyl benzotriazole and 5-carboxyl benzotriazole |
| S-1 | Aluminum salt to which 3 mol of nitrosophenylhydroxylamine is added |

The invention claimed is:

1. A photosensitive resin multilayer film comprising a support film and a photosensitive resin layer comprising a photosensitive resin composition comprising:
   (A) an alkali-soluble polymer: 10% by weight to 90% by weight,
   (B) a compound having an ethylenically unsaturated double bond: 5% by weight to 70% by weight, and
   (C) a photopolymerization initiator: 0.01% by weight to 20% by weight, the photosensitive resin layer being laminated on the support film, wherein
   the alkali-soluble polymer (A) comprises a copolymer comprising a (meth)acrylate which has an alkyl group having 3 to 12 carbon atoms as a copolymerization component,
   an acrylate monomer is contained as the compound having an ethylenically unsaturated double bond (B) in an amount of 51% by weight to 100% by weight based on the total amount of the compound having an ethylenically unsaturated double bond (B),
   a relationship represented by the following inequality (I) is satisfied:

$$0 < A/T \leq 0.007 \qquad \text{Inequality (I)}$$

where T (μm) is a thickness of the photosensitive resin layer comprising the photosensitive resin composition, and A is an absorbance at a wavelength of 365 nm,
   the thickness of the photosensitive resin layer comprising the photosensitive resin composition is 40 μm or more and 600 μm or less, and the photosensitive resin multilayer film comprises, as the photopolymerization initiator (C), an imidazole compound.

2. The photosensitive resin multilayer film according to claim 1, wherein the alkali-soluble polymer (A) comprises a copolymer comprising 2-ethylhexyl acrylate as the copolymerization component.

3. The photosensitive resin multilayer film according to claim 1, wherein the alkali-soluble polymer (A) comprises a copolymer comprising benzyl (meth)acrylate as the copolymerization component.

[Chemical Formula 1]

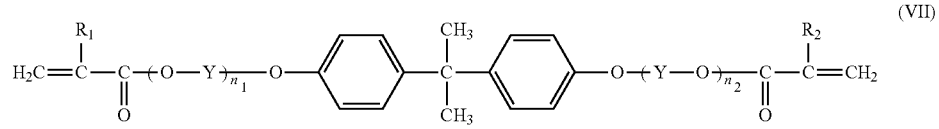

4. The photosensitive resin multilayer film according to claim 1, wherein the alkali-soluble polymer (A) further comprises a (meth)acrylate other than the (meth)acrylate which has an alkyl group having 3 to 12 carbon atoms, and/or a vinyl compound, as the copolymerization component, and
the alkali-soluble polymer (A) comprises the (meth)acrylate which has an alkyl group having 3 to 12 carbon atoms as the copolymerization component in an amount of 6.0% by weight to 30% by weight.

5. The photosensitive resin multilayer film according to claim 1, wherein a trifunctional or higher polyfunctional acrylate group-containing compound is contained as the compound having an ethylenically unsaturated double bond (B).

6. The photosensitive resin multilayer film according to claim 5, wherein a compound having an acrylate group in any of trimethylolpropane, pentaerythritol and dipentaerythritol backbones is contained as the trifunctional or higher polyfunctional acrylate group-containing compound.

7. The photosensitive resin multilayer film according to claim 5, wherein a compound having an acrylate group in any of trimethylolpropane, pentaerythritol and dipentaerythritol backbones is contained as the trifunctional or higher polyfunctional acrylate group-containing compound in an amount of 1% by weight or more based on the total amount of the compound having an ethylenically unsaturated double bond (B).

8. The photosensitive resin multilayer film according to claim 5, wherein a compound having an acrylate group in any of trimethylolpropane, pentaerythritol and dipentaerythritol backbones is contained as the trifunctional or higher polyfunctional acrylate group-containing compound in an amount of 10% by weight or more based on the total amount of the compound having an ethylenically unsaturated double bond (B).

9. The photosensitive resin multilayer film according to claim 5, wherein a compound having an acrylate group in any of trimethylolpropane, pentaerythritol and dipentaerythritol backbones is contained as the trifunctional or higher polyfunctional acrylate group-containing compound in an amount of 80% by weight or more based on the total amount of the compound having an ethylenically unsaturated double bond (B).

10. The photosensitive resin multilayer film according to claim 1, wherein, when a compound having an aromatic ring is contained as the compound having an ethylenically unsaturated double bond (B), the compound having an aromatic ring is represented by the following formula (VII):

wherein Y each independently represents an alkylene group having 2 to 10 carbon atoms, $R_1$ and $R_2$ each independently represent a methyl group or a hydrogen atom, and $n_1$ and $n_2$ each independently represent an integer of 1 to 100.

11. The photosensitive resin multilayer film according to claim 1, comprising, as the photopolymerization initiator (C), a 2,4,5-triarylimidazole dimer.

12. The photosensitive resin multilayer film according to claim 1, wherein a relationship represented by the following inequality (II) is satisfied:

$$0 < A/T \leq 0.005 \qquad \text{Inequality (II)}$$

where T (μm) is a thickness of the photosensitive resin layer comprising the photosensitive resin composition, and A is an absorbance at a wavelength of 365 nm.

13. The photosensitive resin multilayer film according to claim 1, wherein the thickness of the photosensitive resin layer comprising the photosensitive resin composition is more than 50 μm and 400 μm or less.

14. The photosensitive resin multilayer film according to claim 1, which is a dry film resist.

15. A method for forming a resist pattern, which comprises the steps of:
laminating the photosensitive resin multilayer film according to claim 1 on a substrate,
exposing the laminated photosensitive resin multilayer film, and
developing the exposed photosensitive resin multilayer film.

16. A method for forming a semiconductor bump, which comprises the steps of:
laminating the photosensitive resin multilayer film according to claim 1 on a sputtered copper thin film,
exposing the laminated photosensitive resin multilayer film,
developing the exposed photosensitive resin multilayer film, and
subjecting the developed sputtered copper thin film to copper plating or solder plating.

* * * * *